(12) United States Patent
Ma

(10) Patent No.: US 12,713,718 B2
(45) Date of Patent: Aug. 18, 2026

(54) VERTICAL PUMP-GATE CHARGE TRANSFER FOR HIGH-CONVERSION-GAIN CMOS IMAGE SENSOR PIXELS

(71) Applicant: Gigajot Technology, Inc., Glendale, CA (US)

(72) Inventor: Jiaju Ma, Monrovia, CA (US)

(73) Assignee: Gigajot Technology, Inc., Glendale, CA (US)

( * ) Notice: Subject to any disclaimer, the term of this patent is extended or adjusted under 35 U.S.C. 154(b) by 619 days.

(21) Appl. No.: 18/069,344

(22) Filed: Dec. 21, 2022

(65) Prior Publication Data

US 2023/0197757 A1 Jun. 22, 2023

Related U.S. Application Data

(60) Provisional application No. 63/292,569, filed on Dec. 22, 2021.

(51) Int. Cl.
*H10F 39/18* (2025.01)
*H10F 39/00* (2025.01)
*H10F 39/12* (2025.01)

(52) U.S. Cl.
CPC ........... *H10F 39/18* (2025.01); *H10F 39/199* (2025.01); *H10F 39/80373* (2025.01); *H10F 39/812* (2025.01)

(58) Field of Classification Search
CPC .. H10F 39/18; H10F 39/199; H10F 39/80373; H10F 39/812; H10F 39/802;
(Continued)

(56) References Cited

U.S. PATENT DOCUMENTS 8,614,759 B2 12/2013 Watanabe et al.
8,792,035 B2 7/2014 Yamada
(Continued)

FOREIGN PATENT DOCUMENTS

KR 20140133814 A 11/2014
WO 2013118646 8/2013
WO 2018180574 10/2018

OTHER PUBLICATIONS

Chapman, P. W., et al. "Electrical properties of heavily doped silicon." Journal of Applied Physics 34.11 (1963): 3291-3295. (Year: 1963).*

(Continued)

*Primary Examiner* — Norman D Richards
*Assistant Examiner* — Ethan Edward Cutler
(74) *Attorney, Agent, or Firm* — Robert C. Kowert; Kowert, Hood, Munyon, Rankin & Goetzel, P.C.

(57) ABSTRACT

An image sensor may include a plurality of pixels. At least some of the pixels may each include a photodiode having a charge accumulation region ("PD"), a floating diffusion region ("FD"), and a vertical gate transfer ("GT"). The GT may include one or more charge transfer regions formed vertically between PD and FD. The GT may also include a gate control region ("gate") that may be formed in a vertical trench and be disposed laterally proximate the one or more charge transfer regions of the GT. By applying a control signal to the gate, the GT may selectively transfer at least some charge accumulated in PD to FD vertically through the one or more charge transfer regions of GT between PD and FD.

20 Claims, 10 Drawing Sheets

(58) Field of Classification Search
CPC ............. H10F 39/8033; H10F 39/8037; H10F 39/807; H10F 39/813
See application file for complete search history.

(56) References Cited

U.S. PATENT DOCUMENTS

| | | | | |
|---|---|---|---|---|
| 10,163,962 | B2 | 12/2018 | Tayanaka | |
| 2011/0049590 | A1* | 3/2011 | Itonaga | H10F 39/813 257/292 |
| 2011/0181749 | A1 | 7/2011 | Yamada | |
| 2016/0343751 | A1* | 11/2016 | Sze | H10F 39/8053 |
| 2017/0018584 | A1 | 1/2017 | Ma et al. | |
| 2019/0237499 | A1 | 8/2019 | Roy | |
| 2019/0252428 | A1 | 8/2019 | Ma et al. | |

OTHER PUBLICATIONS

Watson, R. W., et al. "A display processor design." Proceedings of the Nov. 18-20, 1969, fall joint computer conference. 1969. (Year: 1969).*

Office Action from Japanese Patent Application No. 2024-535780, dated Mar. 7, 2025, pp. 1-3.

Office Action mailed May 12, 2025 in Korean Patent Application No. 10-2024-7019720, 11 pages (including translation).

* cited by examiner

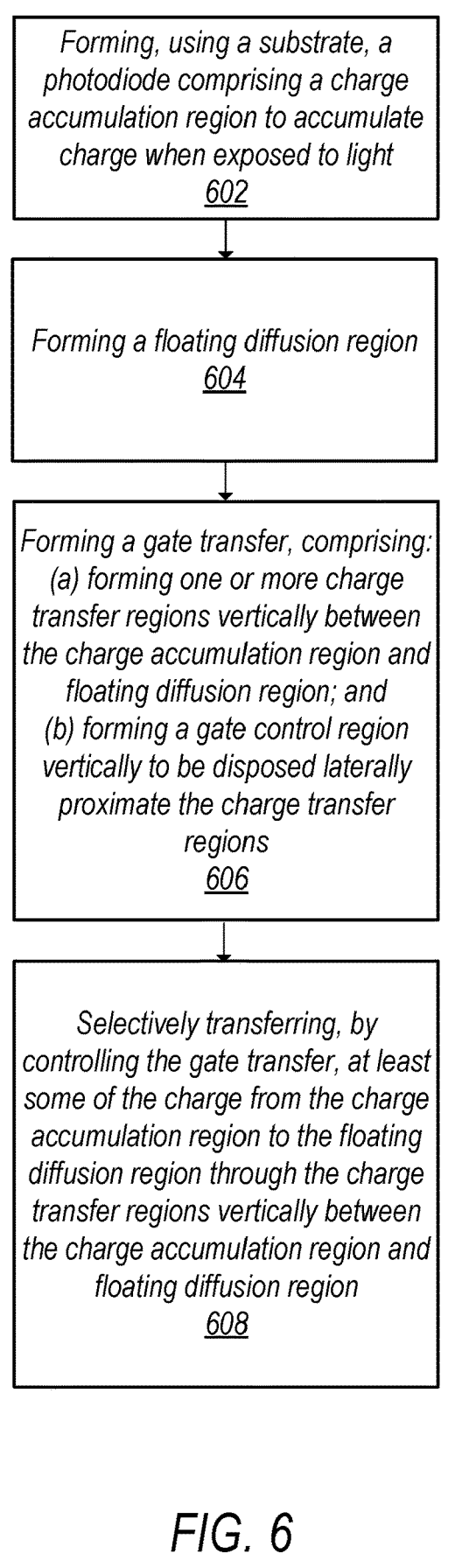

Forming, using a substrate, a photodiode comprising a charge accumulation region to accumulate charge when exposed to light
602

Forming a floating diffusion region
604

Forming a gate transfer, comprising:
(a) forming one or more charge transfer regions vertically between the charge accumulation region and floating diffusion region; and
(b) forming a gate control region vertically to be disposed laterally proximate the charge transfer regions
606

Selectively transferring, by controlling the gate transfer, at least some of the charge from the charge accumulation region to the floating diffusion region through the charge transfer regions vertically between the charge accumulation region and floating diffusion region
608

FIG. 6

VERTICAL PUMP-GATE CHARGE TRANSFER FOR HIGH-CONVERSION-GAIN CMOS IMAGE SENSOR PIXELS

This application claims benefit of priority of U.S. Provisional Application Ser. No. 63/292,569, entitled "Vertical Pump-Gate Charge Transfer for High-Conversion-Gain CMOS Image Sensor Pixel", filed Dec. 22, 2021, which is hereby incorporated in reference herein in its entirety.

BACKGROUND

Technical Field

This disclosure relates generally to an image sensor and more specifically to pixels of an image sensor having vertical pump gate transfer.

Description of the Related Art

Image capturing devices, such as cameras, are widely used in various electronic devices, such as mobile devices (e.g., smart phones, tablets, laptops, etc.), robotic equipment, or security monitoring devices, among others. An image capturing device may include an image sensor having a plurality of light-gathering pixels. Each pixel may include a photodiode. The image capturing device may capture light from an environment and pass the light to the image sensor. When exposed to light, photodiodes of the pixels may accumulate electrical charge. At readout, the electrical charge of the photodiodes may be read out of the photodiodes, using one or more transistors, to generate analog image signals. The analog image signals may be converted to digital signals and further processed to produce images.

BRIEF DESCRIPTION OF THE DRAWINGS

FIG. 6 is a flowchart showing an example method for using a gate transfer having a vertical gate to control charge transfer of a pixel, according to some embodiments.

Figure 1:
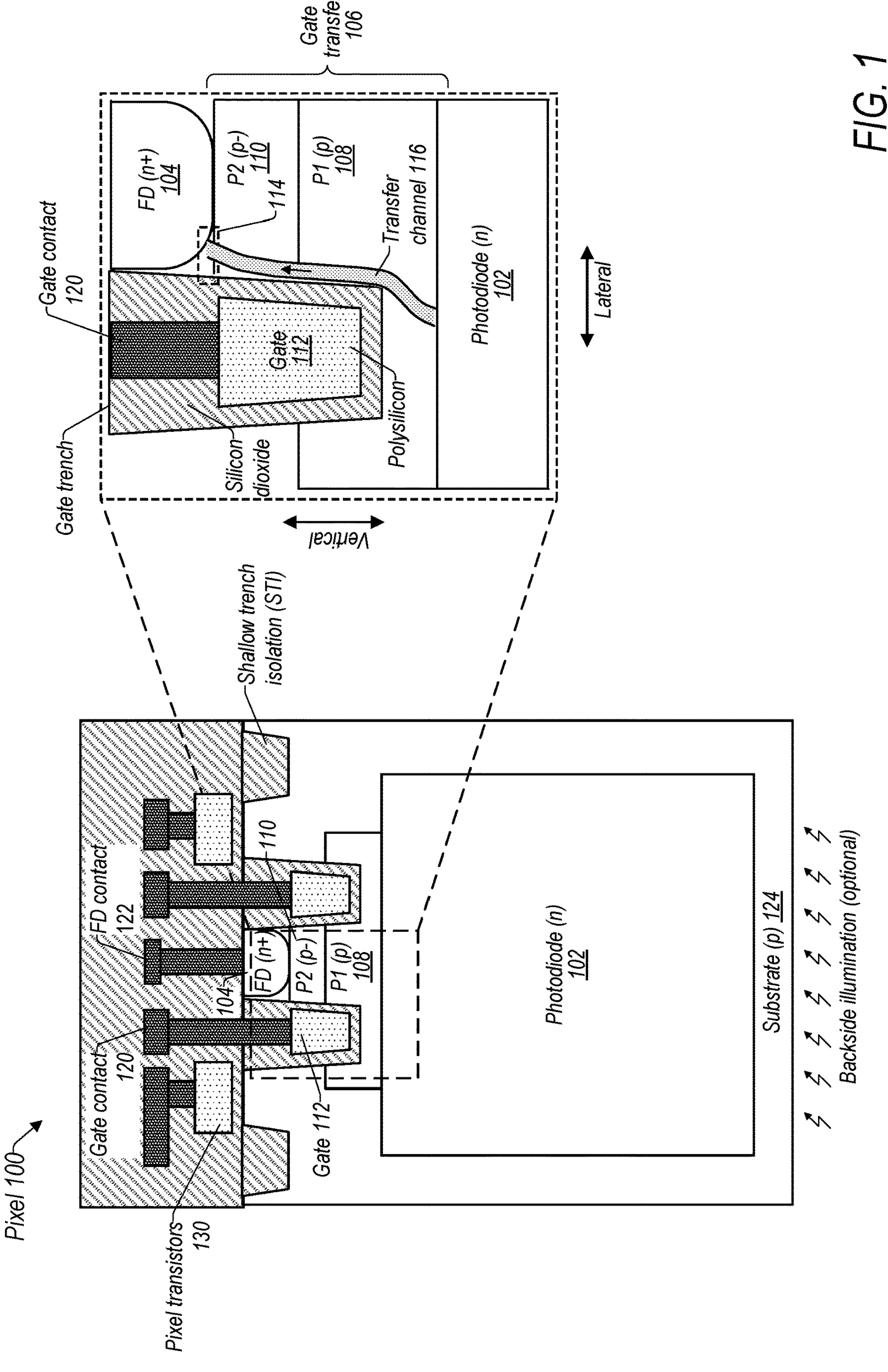
FIG. 1 is a cross-section view of an example pixel, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to an image sensor having a plurality of pixels, and at least some of the pixels each may include a vertical pump gate transfer. In some embodiments, each of the at least some pixels may include at least one photodiode comprising a charge accumulation region (hereinafter "PD"), at least one floating diffusion region (hereinafter "FD"), and at least one gate transfer (hereinafter "GT"). In some embodiments, the image sensor may be part of an image capturing device, such as a camera. The image capturing device may include one or more lenses. The lenses may pass through light that is captured by the image capturing device to the image sensor. When exposed to light, PD may accumulate electrical charge, e.g., electrons or holes. At least some of the charge may be transferred from PD to FD, e.g., during readout, to generate an image signal, e.g., an analog voltage. In some embodiments, the image signals from the pixels may be further processed, e.g., analog-to-digital converted by analog-to-digital converter(s) and digitally processed by an image signal processor (ISP), to generate one or more images.

In some embodiments, GT may include a vertical pump gate formed by a first charge transfer region (hereinafter "P1"), a second charge transfer region (hereinafter "P2"), and a gate control region (hereinafter "gate"). In some embodiments, P1 may be formed above and at least partially overlap PD, whereas P2 may be formed (a) above and at least partially overlap P1 and (2) underneath and at least partially overlap FD. As a result, P1 and P2 collectively may form a region vertically between PD and FD. In some embodiments, the gate of GT may be a vertical gate disposed laterally proximate P1 and P2, which may thus create a channel through P1 and P2 under the field effect when being applied to a control signal, e.g., a voltage. In some embodiments, by controlling the voltage applied to the gate, GT may selectively transfer some or all of the charge vertically from PD to FD via the channel through P1 and P2. In some embodiments, transfer of the charge may be performed in two phases. For example, in the first phase GT may be turned on to pump the charge from PD to P1 and then to P2, and in the second phase GT may be turned off to pump the charge from P2 to FD.

FIG. 1 is a cross-section view of an example pixel, according to some embodiments. The view on the right is an expanded view of a portion (marked by dashed lines) of the pixel at left. As shown in FIG. 1, pixel 100 may include at least one photodiode comprising a charge accumulation region ("PD") 102, floating diffusion ("FD"), and gate transfer ("GT") 106. In some embodiments, GT 106 may include a first charge transfer region ("P1") 108, a second charge transfer region ("P2") 110, and gate control region ("gate") 112. Gate 112 and FD 122 may be further connected with respective metal contacts 120 and 122. As described above, PD 102 may accumulate electrical charge (e.g., electrons) when exposed light. The charge may be transferred from PD 102 through GT 106 to FD 104. The transfer of charge may cause an image signal, e.g., an analog voltage, at FD 104, which may be read out through metal contact 122. In FIG. 1, in some embodiments, pixel 100 may also include one or more pixel transistors 130 to implement readout of the image signal from pixel 100. In some embodiments, pixel 100 may be implemented based on substrate 124. Also, as shown in FIG. 1, in this example, pixel 100 may be configured to receive backside illumination. But alternatively, in some embodiments, front side illumination may be implemented.

As shown in FIG. 1, in some embodiments, P1 108 may be formed above and at least partially overlap PD 102. P2 110 may be formed above and at least partially overlap P1 108. In addition, P2 110 may be underneath and at least partially overlap FD 104. Thus, P1 and P2 collectively may form a region vertically between PD 102 and FD 104. In this disclosure, "vertical" refers to the vertical direction in the cross-section view of FIG. 1, e.g., from bottom to top in the cross-section view or from the backside surface to the front side surface of substrate 124. Further, as shown in FIG. 1, at least a portion of P2 110 may be disposed away and separated from FD 104 by physical gap 114. In some embodiments, physical gap 114 may provide a potential barrier (e.g., an electrostatic potential barrier) between P2 110 and FD 104, which may impede the transfer of charge from PD 102 to FD 104. As shown in FIG. 1, in some embodiments, gate 112 may be implemented as a vertical gate and disposed laterally proximate P1 108 and P2 110. Thus, gate 112 may at least partially overlap P1 108 and P2 110 to be able to create channel 116 through P1 108 and P2 110 for charge transfer under the field effect. For example, when a positive voltage is applied to gate 112, the positive voltage may repel holes in the layer of P1 108 and P2 110 interfacing gate 112 away from gate 112 to thus create channel 116, as shown in FIG. 1. In other words, a n-type field effect transistor may be formed, where electrons may flow from a source (e.g., PD 102) to a drain (e.g., FD 104) via a n-type channel (e.g., channel 116 formed through P1 108 and P2 110). In some embodiments, physical gap 114 may be formed near the portion of P2 110, e.g., around the intersection between channel 116 (through P1 108 and PD 110) and FD 104, such that the potential barrier created by physical gap 114 may impede the transfer of charge from PD 102 to FD 104 through channel 116. In some embodiments, as shown in FIG. 1, gate 112 may not necessarily overlap FD 104 in the vertical direction. The nonoverlapping may create a distance between gate 112 and FD 104, thus reducing parasitic capacitance on FD 104. In some embodiments, reduction of the parasitic capacitance of FD 104 may increase the conversion gain of pixel 100, such that value of the image signal may be increased even when pixel 100 is exposed to low intensity or dim light. In some embodiments, gate 112 may be formed vertically inside a shallow trench. For example, as shown in FIG. 1, the trench may extend in the vertical direction, laterally proximate P1 108 and P2 110, and at least partially overlap P1 108 and P2 110. In some embodiments, the trench may be filled with polycrystalline silicon (also called polysilicon), for example, at or near the bottom of the trench to form gate 112. Gate 112 may be connected with metal contact 120, and the remaining portions of the trench may be filled with silicon dioxide, for example. In addition, as shown in FIG. 1, in some embodiments, pixel 100 may include shallow trench isolation (STI), which may have a shorter depth than the trench of vertical gate 112. Alternatively, in some embodiments, pixel 100 may instead use deep trench insulation having deeper trenches than the trench of vertical gate 112. Also, in some embodiments, PD 102 may be extended to the regions underneath pixel transistors 130 to increase the fill-factor and quantum efficiency.

In some embodiments, GT 106 may be controlled to selectively transfer at least some of the charge from PD 102 to FD 104 vertically through P1 108 and P2 110. For example, in some embodiments, a control signal, e.g., a voltage, may be applied to gate 112 of GT 106, which may create vertical channel 116 through P1 108 and P2 110 under the field effect. As a result, charge may be transferred from PD 102 to FD 104 via channel 116, as indicated by the arrow in FIG. 1. Conversely, the voltage may be removed from gate 112, or a different voltage may be applied to remove channel 116. As a result, the transfer of change may be stopped. Note that in this example, pixel 100 may have gates 112 on the left and right in the cross-section view. Thus, the gate may create two channels 116 at both sides of P1 108 and P2 110. For purposes of illustration, in this example, PD 102 may be a n-type region formed with one or more n-type dopants, P1 108 and P2 110 may be p-type regions formed with one or more p-type dopants, and FD 104 may be a n-type region formed with one or more n-type dopants. In some embodiments, P1 108 and P2 110 may use the same dopant(s), and P1 108 may have a higher doping concentration than P2 110. In some embodiments, P1 108 and P2 110 may be formed as two separate regions, both using implants having uniform distributes energies. Alternatively, in some embodiments, P1 108 and P2 110 may be formed as a single doping region but having different doping concentrations. For example, implants (e.g., ion-beams) may be added with purposefully skewed distribution energies to yield a doping gradient, such that the lower region (e.g., P1 108) may have a higher doping concentration than the upper region (e.g., P2 110). Note that the above is only an example provided for purposes of illustration. In some embodiments, PD 102, FD 104, P1 108, and P2 110 of pixel 100 may be doped in other ways to form other types of regions, and/or may be spatially arranged in other ways. For example, in some embodiments, PD 102 and FD 104 and be formed into p-type regions, and P1 108 and P2 110 may be formed into n-type regions, thus resulting into a p-type field effect transistor inside pixel 100. Also, alternatively, in some embodiments, pixel 100 may have different numbers of PD 102, FD 104, GT 106, P1 108, P2 110, and/or gate 112. For example, in some embodiments, pixel 100 may include two PD 102, two GT 106 (each having one P1 108, one P2 110, and one or more gates 112), and one FD 104, where the two PD 102 may share the same FD 104 and each GT 106 may control the transfer of charge from each PD 102 to the shared GT 106. Also, alternatively, in some embodiments, GT 106 may not necessarily include the charge transfer regions P1 108 and P2 110. Instead, gate 112 may be entrenched to be formed above PD 102 and underneath FD 104, and thus directly form a charge transfer region between PD 102 and FD 104.

Figure 2:
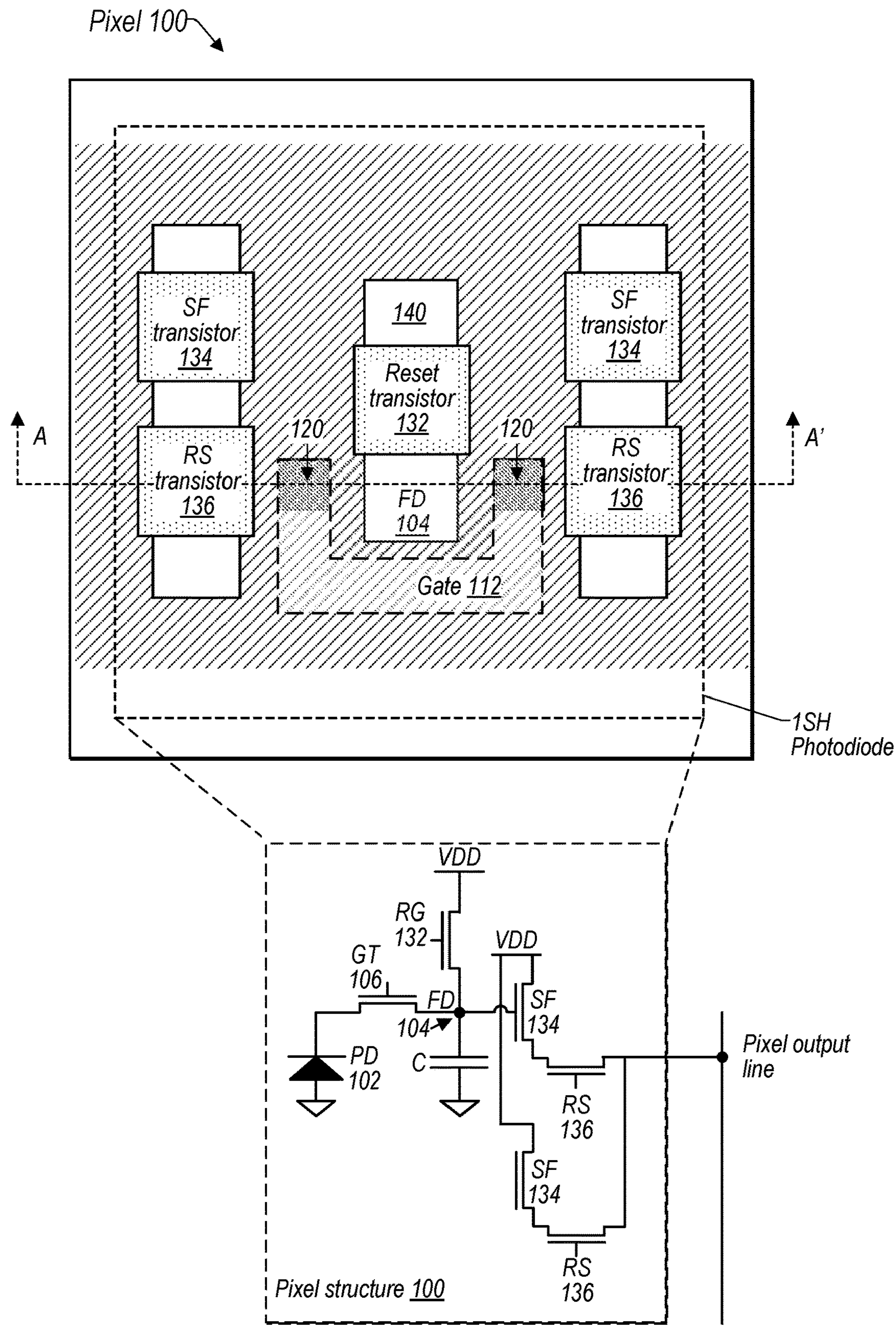
FIG. 2 is a top view of an example pixel, according to some embodiments.

FIG. 2 is a top view of an example pixel, according to some embodiments. In FIG. 2, the cutline A-A' indicates the view direction of the cross-section view in FIG. 1. As shown in FIG. 2, in some embodiments, gate 112 of GT 106 may be formed in a U shape at least partially encircling a perimeter of FD 104. Alternatively, in some embodiments, gate 112 may have a ring shape to completely encircle FD 104. Although gate 112 encircles FD 104 in the lateral direction, gate 112 may not necessarily go directly underneath or vertically overlap FD 104 as described above in FIG. 1.

As described above in FIG. 1, in some embodiments, pixel 100 may include one or more pixel transistors 130 to implement readout of the image signal from pixel 100. For example, as shown in FIG. 2, in some embodiments, pixel 100 may include at least one reset transistor ("RG") 132, one or more source-follower transistors ("SF") 134, and/or one or more read selection transistor ("RS") 136. With the pixel transistors, pixel 100 may form a circuit shown by the schematic diagram in FIG. 2. As shown here, PD 102 may be coupled to FD 104 via GT 106. Thus, by turning on GD 104, charge may transfer from PD 102 to FD 104. Given the capacitance C at FD 104, the transfer of charge may cause a current to be integrated through capacitance C, thus resulting in an analog voltage at FD 104. Also, as shown in FIG. 2, FD 104 may be also coupled to a reset voltage VDD via RG 132, e.g., using metal contact 140 shown in the top view. RG 132 may be selectively turned on to reset the voltage of FD 104 to VDD. Further, as shown in FIG. 2, FD 104 may be also coupled with one or more SF 134 and one or more RS 136. In some embodiments, SF 134 and RS 136 may be turned on to couple FD 104 to the pixel output line, through which the voltage of FD 104 may be accessed and read out. In some embodiments, SF 134 may provide a voltage buffer for the voltage of FD 104, whereas RS 136 may be selectively turned on to couple FD 104 with the pixel output line for reading out the voltage of FD 104. During readout, SF 134 and RS 136 may be first turned on to couple FD 104 to the pixel output line. Next, RG 132 may be turned on to reset the voltage of FD 104 to the reset voltage VDD. The voltage of FD 104 may be sampled, e.g., using analog-to-digital converter(s), as a first sample of the voltage of FD 104. Next, RG 132 may be turned off, and GT 106 may be turned on. The turning off of RG 132 and turning on of GT 106 may or may not be performed at or around the same time. When GT 106 is turned on, the charge of PD 102 may be transferred to FD 104, as described above, to generate an analog voltage across the capacitance C of FD 104. The voltage of FD 104 may be further accessed and read out at the pixel output line through SF 134 and RS 136. The voltage of FD 104 may be sampled again, e.g., using the analog-to-digital converter(s), as a second sample of the voltage of FD 104. The difference between the first sample and second sample may be calculated to cancel out the reset voltage, and the differential voltage may be determined as the final image signal from pixel 100. This image signal may be provided, together with image signals from other pixels, to an image signal processor (ISP) to be processed to produce an image. In some embodiments, pixel 100, including the various components described above, may be implemented as an integrated circuit on a substrate (e.g., substrate 124).

Figure 3A:
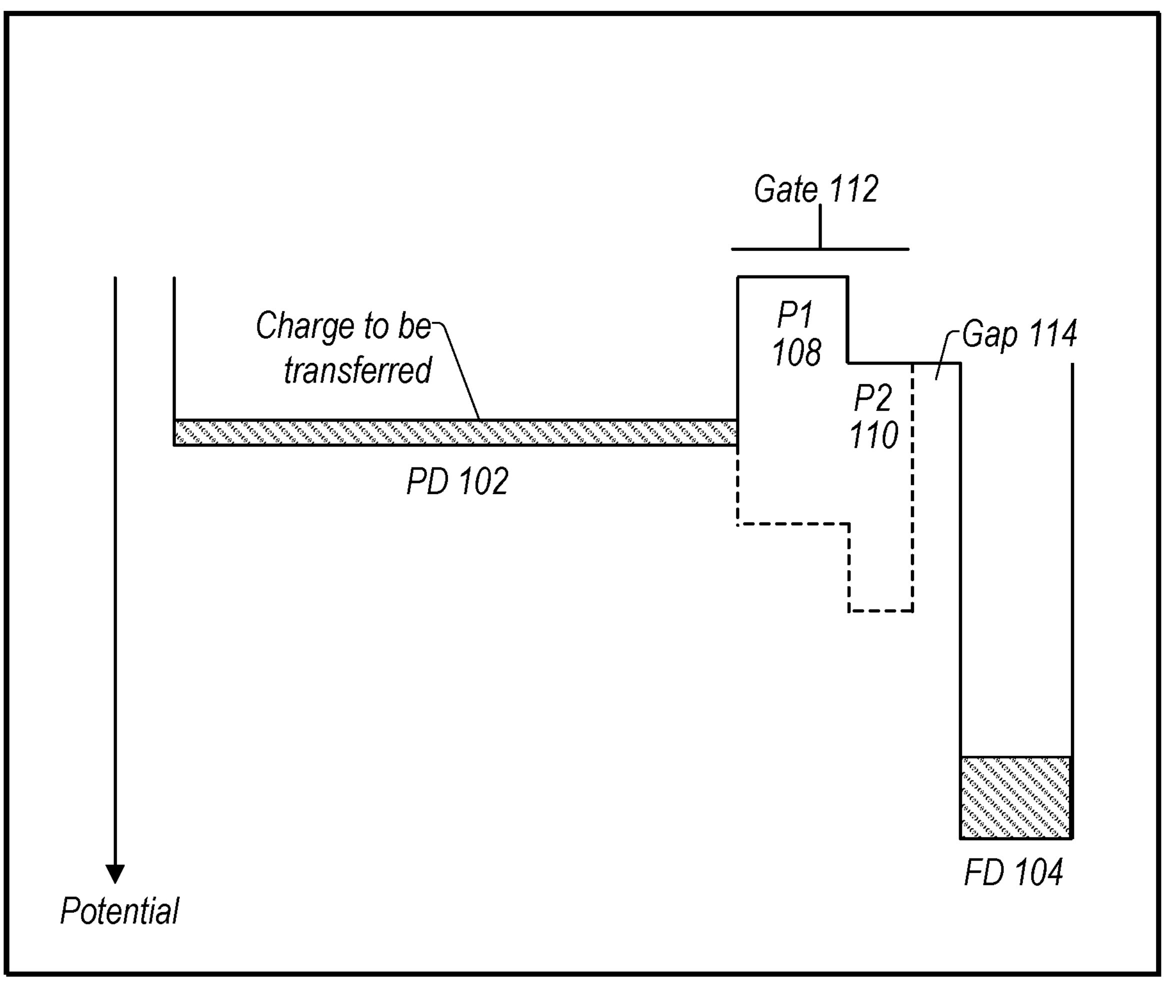
FIGS. 3A-3C show an example potential profile along a charge transfer channel, according to some embodiments.
Figure 3B:
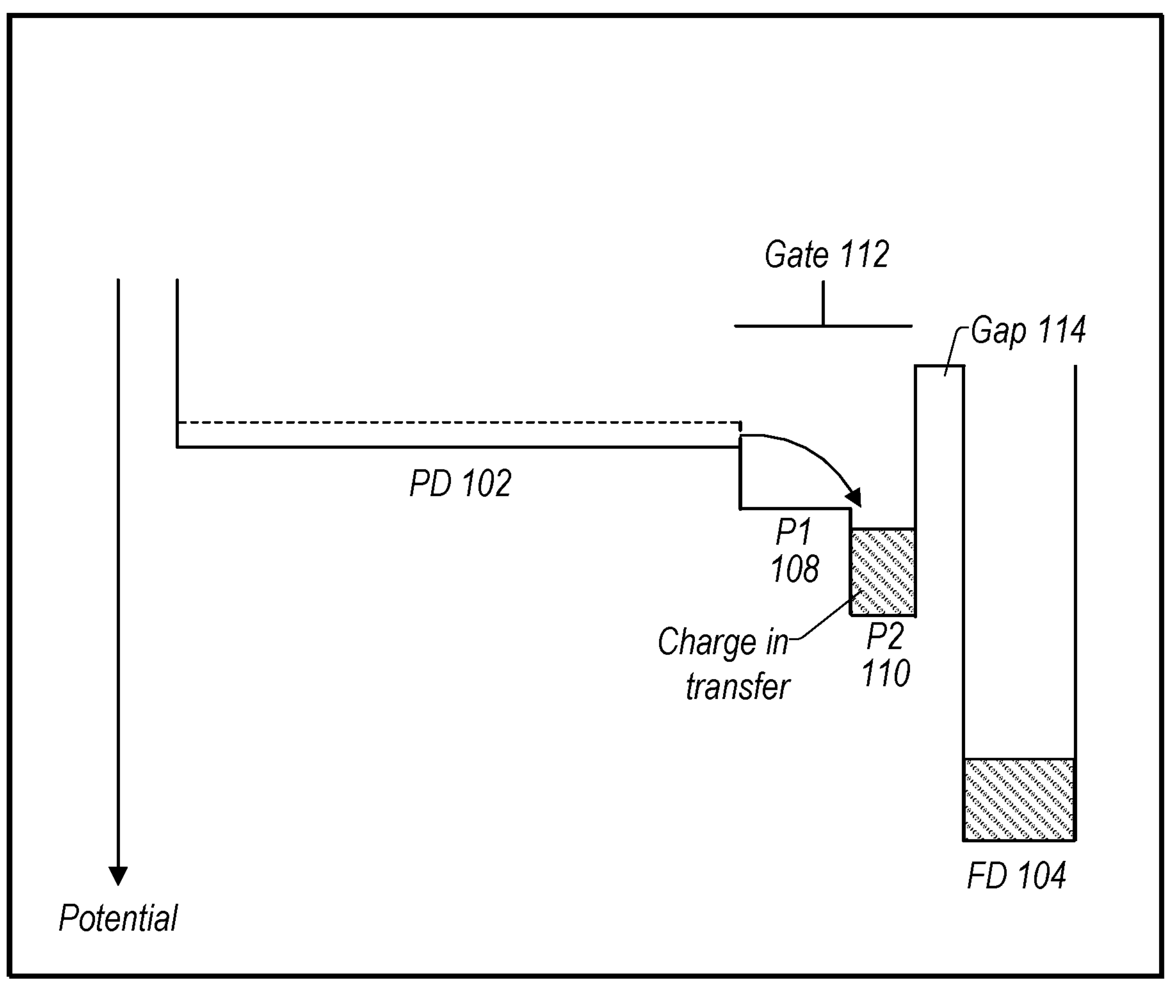
Figure 3C:
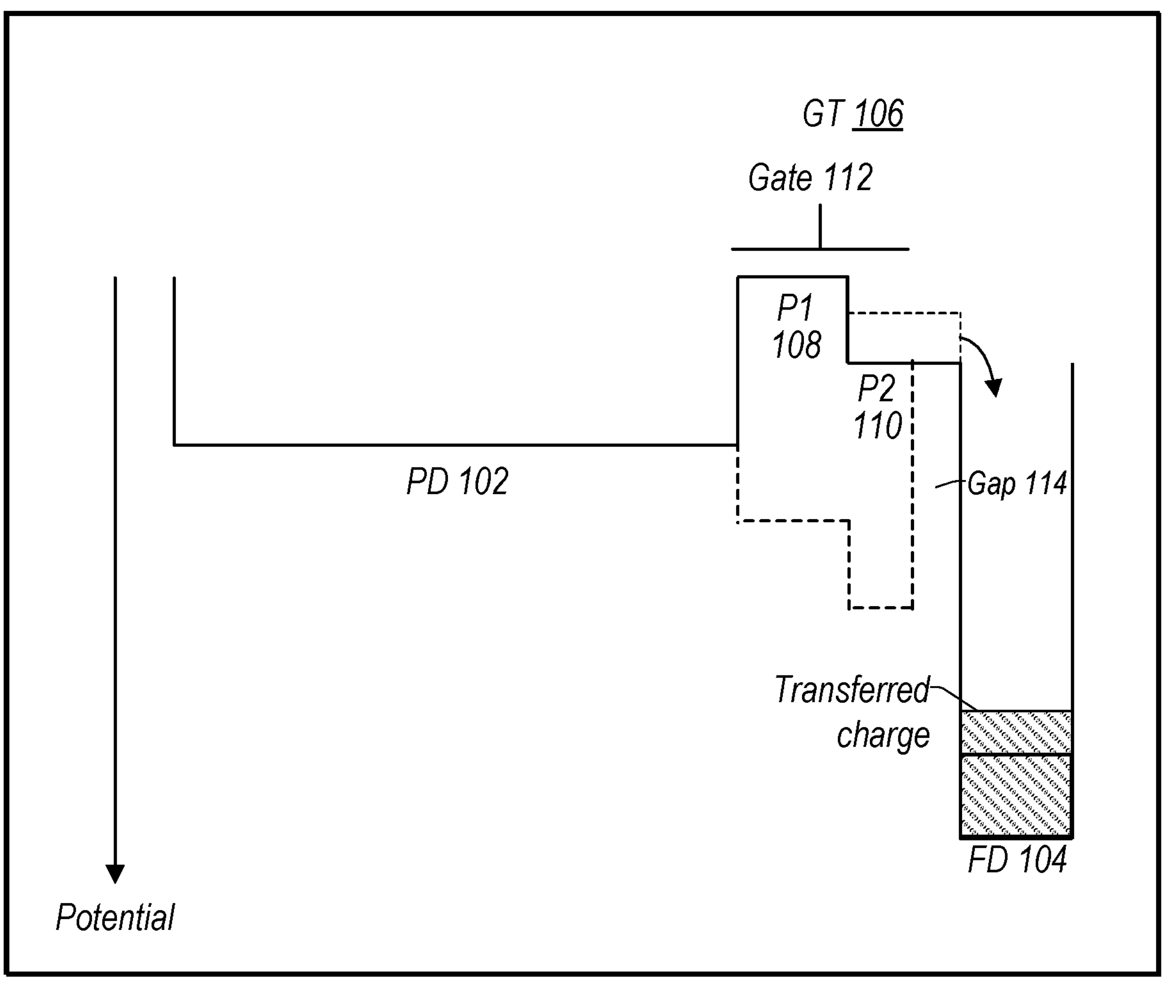

FIGS. 3A-3C show an example potential profile along a charge transfer channel, according to some embodiments. For purposes of illustration, in this example, it is assumed that PD 102 may be a n-type region, P1 108 and P2 110 may be p-type regions and P1 108 may have a higher doping concentration than P2 110, and FD 104 may be a n-type region. In FIG. 3A, GT 106 is turned off, e.g., when gate 112 is biased at zero or a negative voltage. Given the doping types of these regions in this example, the potential profile of PD 102, P1 108, P2 110, and FD 104 may have a multi-stepped shape, as shown in the figure. For example, because of the different doping concentrations of P1 108 and P2 110, P1 108 may have a lower potential than P2 110, thus showing the two-stepped profile in FIG. 3A. Also, as described above, in some embodiments, at least a portion of P2 110 may be disposed away and separated from FD 104 by physical gap 114, and physical gap 114 may generate a potential barrier (e.g., an electrostatic potential barrier) between P2 110 and FD 104. However, because gate 106 is biased at zero or a negative voltage, the potential of P2 110 may become lower than the potential barrier created by physical gap 114. Given the potential profile of FIG. 3A, in this operational mode, when exposed to light, charge may be accumulated and held inside PD 102.

In FIG. 3B, GT 106 may be turned on, e.g., when gate 112 is biased at a positive voltage. In some embodiments, P1 108 and P2 110 may follow the applied voltage to gate 112. As a result, channel 116 may be formed through P1 108 and P2 110. Thus, at least some of the charge may be pumped from PD 102 to P1 108. Also, as described above, because P1 108 may have a lower potential than P2 110, the charge may further flow P1 108 to P2 110, as indicated by the arrow in FIG. 3B. In addition, since gate 106 is biased at a positive voltage, the potential of P2 110 may become higher than the potential barrier created by physical gap 114. Thus, in the operational mode of FIG. 3B, once the charge transfers to P2 110, it may be blocked by the potential barrier created by physical gap 114 between P2 110 and FD 104 and thus may not necessarily flow to FD 104. As a result, the charge may be temporarily held in P2 110.

In FIG. 3C, GT 106 may be turned off, e.g., the positive voltage is removed from gate 112, or gate 112 is biased to zero or a negative voltage. The potential profile may recover to the starting level of FIG. 3A. Thus, the potential of P2 110 may again become lower than the potential barrier created by physical gap 114. As a result, the charge in PD 112 may be pumped from PD 112 to FD 104 over physical gap 114. Further, because the potential of P1 108 is lower than P2 110, as described above, the charge may be prevented from flowing from P2 110 back to PD 102 through P1 108. In combination of FIGS. 3A-3C, it can be seen that the transfer of charge from PD 102 to FD 104 may be implemented in two phases. In the first phase, when GT 106 is turned on, at least some charge may transfer from PD 102 through P1 108 to P2 110. In the second phase, when GT 106 is turned off, the at least some charge may transfer from P2 110 to FD 104.

Figure 4:
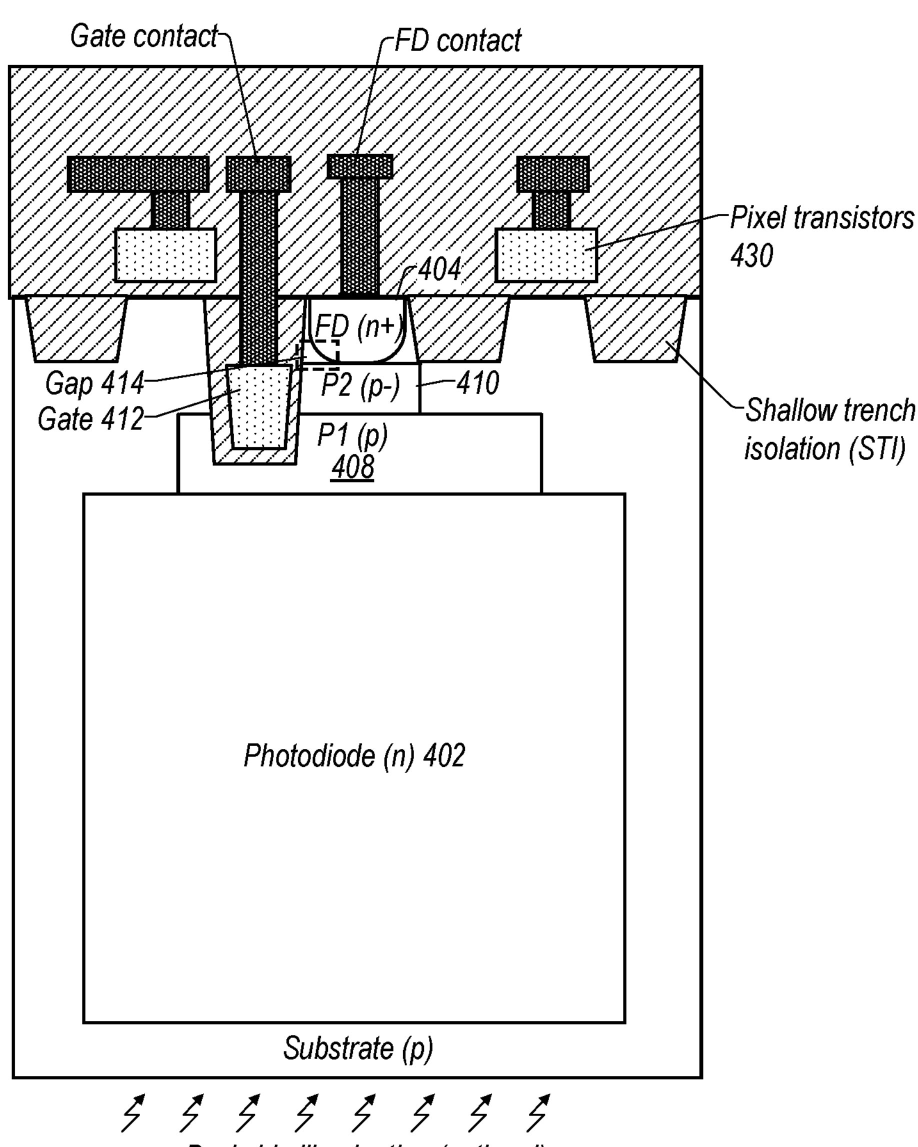
FIG. 4 is a cross-section view of another example pixel, according to some embodiments.

FIG. 4 is a cross-section view of another example pixel, according to some embodiments. As shown in FIG. 4, pixel 400 is similar to pixel 100 of FIG. 1, except that the gate transfer of pixel 400 may include one single vertical gate 412. As shown in FIG. 4, pixel 400 may include PD 402 and FD 404. In some embodiments, the gate transfer may also include P1 408 and P2 410, disposed vertically between FD 402 and FD 404. Also, at least one portion of PD 410 may be disposed away and separated from FD 404 by physical gap 414, which may provide a potential barrier (e.g., an electrostatic potential barrier) between P2 410 and FD 404, as shown in FIG. 4. In some embodiments, gate 412 may be formed vertically like P1 408 and P2 410, and disposed laterally proximate P1 408 and P2 410. In some embodiments, the gate transfer of pixel 400 may be operated similarly to GT 106 of pixel 100 as described above. For example, in the first one of a two-phase operation, the gate transfer may selectively be turned on to transfer charge from PD 402 through P1 408 to P2 410. In the second one of the two-phase operation, the gate transfer may selectively be turned off to transfer charge from P2 410 to FD 404. Further, as shown in FIG. 4, in some embodiments, pixel 400 may include one or more pixel transistors 430, similar to pixel 100, to form a circuit for image signal to be read out of the pixel. Compared to pixel 100 of FIG. 1, pixel 400 may be less complicated since it includes only one single vertical gate. However, on the other side, since there is only one gate 412 proximate P1 408 and P2 410, the charge transfer channel may be formed only on the left side of P1 408 and P2 410. Thus, in some embodiments, the charge transfer speed of pixel 400 may be slower than pixel 100.

Figure 5:
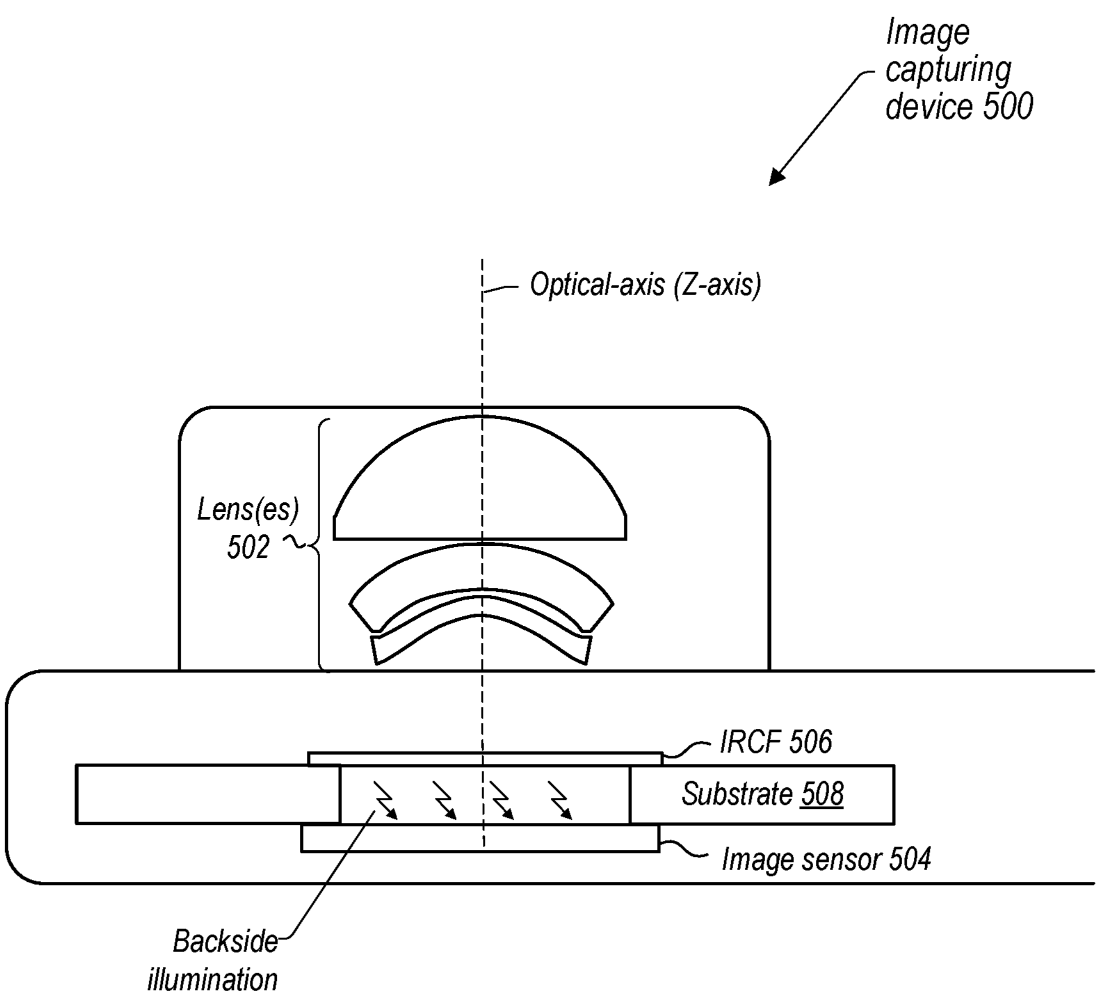
FIG. 5 is a block diagram of an example image capturing device, according to some embodiments.

FIG. 5 is a block diagram of an example image capturing device, according to some embodiments. As shown in FIG. 5, in some embodiments, image capturing device 500 may include one or more lenses 502 and image sensor 504. In some embodiments, image capturing device 500 may capture light from an environment, and the light may pass through lenses 502 to reach image sensor 504. In some embodiments, image sensor 504 may include a plurality of pixels, and at least some of the pixels are similar to the pixels described above where each may include a vertical gate pump transfer. Also, in some embodiments, image capturing device 500 may include infrared cutoff filter (IRCF) 506 placed between lenses 502 and image sensor 504 to block infrared light from reaching image sensor 504. As shown in FIG. 5, in this example, image sensor 504 and IRCF 506 may be mounted on substrate 508, and image sensor 504 may be placed upside down so as to receive backside illumination. But as described above, alternatively, in some embodiments, front side illumination may be implemented on image sensor 504 having the above described pixels. In some embodiments, image sensor 504 may be a CMOS image sensor.

FIG. 6 is a flowchart showing an example method for using a gate transfer having a vertical gate to control charge transfer of a pixel, according to some embodiments. As shown in FIG. 6, in some embodiments, a pixel (similar to the pixels described above) having at least one photodiode with a charge accumulation region ("PD") may be formed on top of a substrate, as shown in block 602. As described above, PD may accumulate electrical charge, e.g., electrons or holes, when exposed to light. In some embodiments, a floating diffusion region ("FD") may be formed as part of the pixel on the substrate, as shown in block 604. In some embodiments, a gate transfer ("GT") may be formed as part of the pixels structure, which may include (a) forming one or more charge transfer regions vertically between PD and FD and (b) forming a gate control region ("gate") vertically to be disposed laterally proximate the one or more charge transfer regions, as shown in block 606. As described above, in some embodiments, the one or more charge transfer regions may include a first charge transfer region ("P1") and a second charge transfer region ("P2"). In some embodiments, P1 may be formed above and at least partially overlap PD. In some embodiments, P2 may be formed (a) above and at least partially overlap P1 and (b) underneath and at least partially overlap FD. As a result, P1 and P2 collectively may form a region between PD and FD. Also, as described above, in some embodiments, at least a portion of P2 may be disposed away and separated from FD by a physical gap to provide a potential barrier. Further, in some embodiments, the gate of GT may be disposed away and not vertically overlap FD. However, the gate of GT may be in a U-shape or ring shape to laterally and at least partially encircle FD. In some embodiments, at least some of the charge may be transferred, by controlling GT, from PD to FD through the one or more charge transfer regions (e.g., P1 and P2) vertically between PD and FD, as shown in block 608. As described above, in some embodiments, transfer of the charge may be performed in two phases. In the first phase, GT may be turned on, e.g., in response to a positive voltage applied to the gate to pump at lease some charge from PD through P1 to P2. In the second phase, GT may be turned off, e.g., in response to removal of the positive voltage from the gate or a negative voltage applied to the gate, to pump the at least some charge from P2 to FD.

Figure 7:
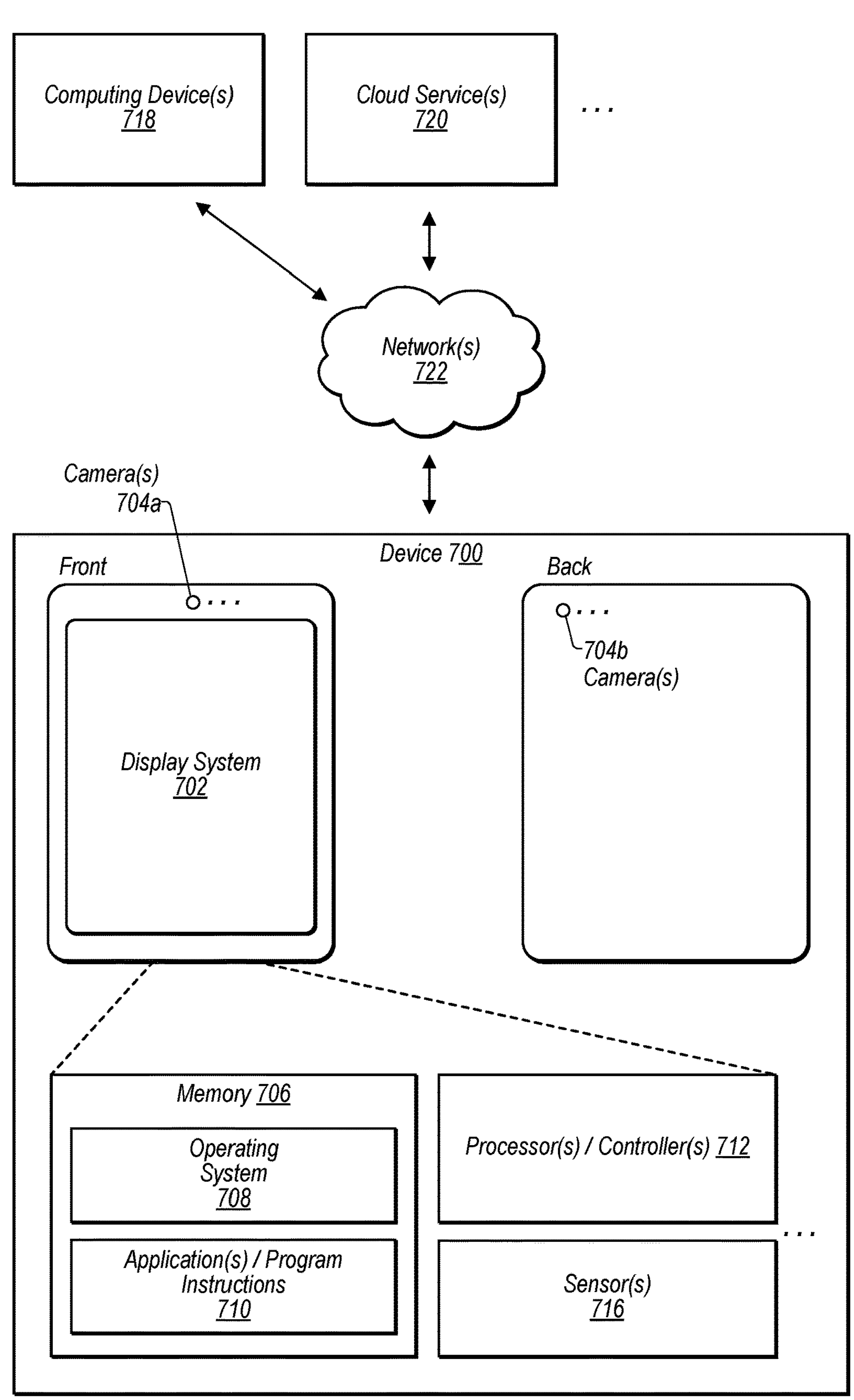
FIG. 7 illustrates a schematic representation of an example device 700 that may include an image capturing device (e.g., a camera) having an image sensor that includes at least some pixels with disclosed vertical gate transfer, according to some embodiments.

FIG. 7 illustrates a schematic representation of an example device 700 that may include an image capturing device (e.g., a camera) having an image sensor that includes at least some pixels with the above described vertical gate transfer, according to some embodiments. In some embodiments, the device 700 may be a mobile device and/or a multifunction device. In various embodiments, the device 700 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 700 may include a display system 702 (e.g., comprising a display and/or a touch-sensitive surface) and/or one or more cameras 704. In some non-limiting embodiments, the display system 702 and/or one or more front-facing cameras 704*a* may be provided at a front side of the device 700, e.g., as indicated in FIG. 7. Additionally, or alternatively, one or more rear-facing cameras 704*b* may be provided at a rear side of the device 700. In some embodiments comprising multiple cameras 704, some or all of the cameras may be the same as, or similar to, each other. Additionally, or alternatively, some or all of the cameras may be different from each other. In various embodiments, the location(s) and/or arrangement(s) of the camera(s) 704 may be different than those indicated in FIG. 7.

Among other things, the device 700 may include memory 706 (e.g., comprising an operating system 708 and/or application(s)/program instructions 710), one or more processors and/or controllers 712 (e.g., comprising CPU(s), memory controller(s), display controller(s), and/or camera controller (s), etc.), and/or one or more sensors 716 (e.g., orientation sensor(s), proximity sensor(s), and/or position sensor(s), etc.). In some embodiments, the device 700 may communicate with one or more other devices and/or services, such as computing device(s) 718, cloud service(s) 720, etc., via one or more networks 722. For example, the device 700 may include a network interface (e.g., network interface 810) that enables the device 700 to transmit data to, and receive data from, the network(s) 722. Additionally, or alternatively, the device 700 may be capable of communicating with other devices via wireless communication using any of a variety of communications standards, protocols, and/or technologies.

Figure 8:
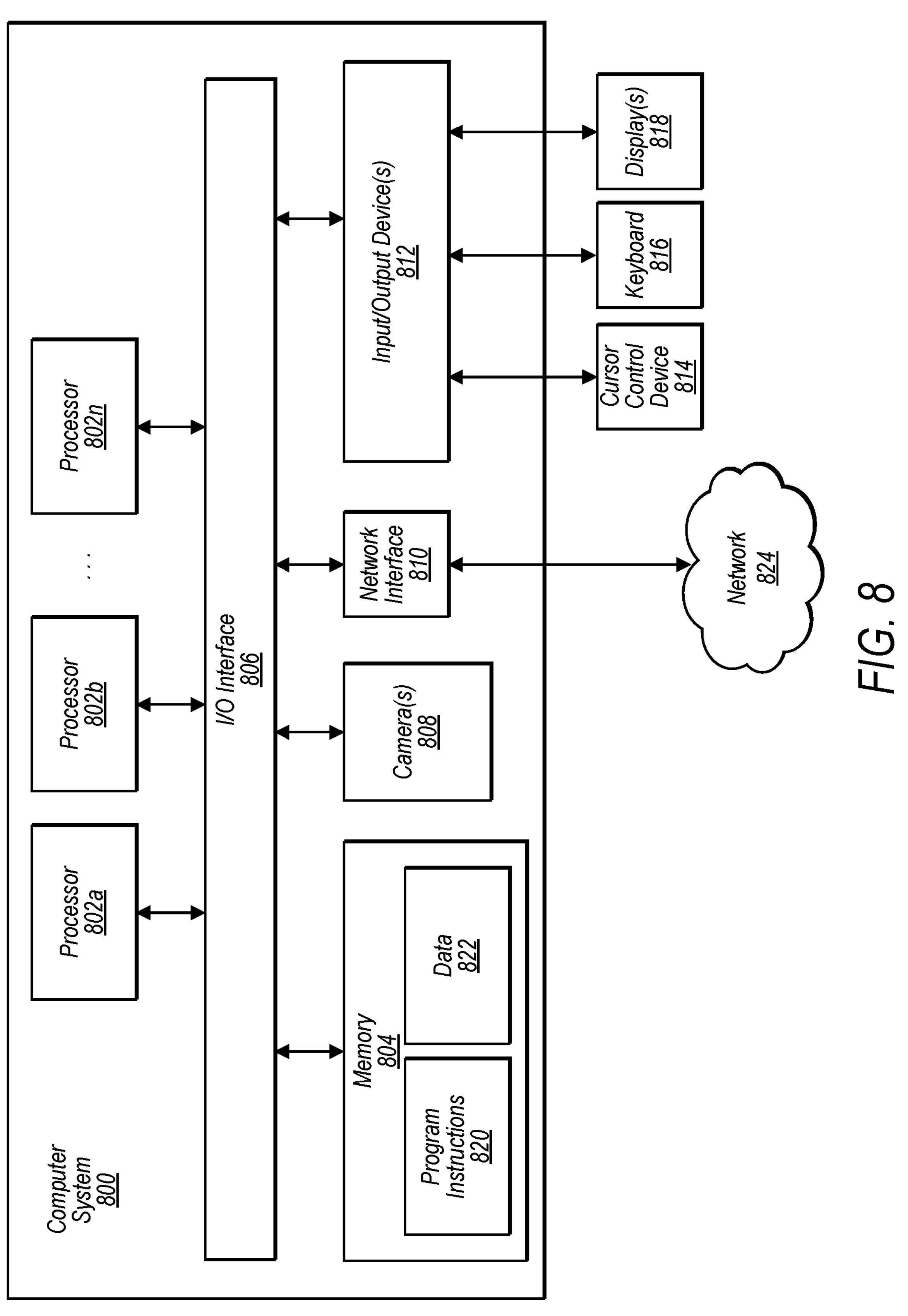
FIG. 8 illustrates a schematic block diagram of an example computing device, referred to as computer system 800, that may include or host embodiments of an image capturing device (e.g., a camera) having an image sensor that includes at least some pixels with disclosed vertical gate transfer, according to some embodiments.

FIG. 8 illustrates a schematic block diagram of an example computing device, referred to as computer system 800, that may include or host embodiments of an image capturing device (e.g., a camera) having an image sensor that includes at least some pixels with the above described vertical gate transfer, according to some embodiments. In addition, computer system 800 may implement methods for controlling operations of the camera and/or for performing image processing images captured with the camera. In some embodiments, the device 700 (described herein with reference to FIG. 7) may additionally, or alternatively, include some or all of the functional components of the computer system 800 described herein.

The computer system 800 may be configured to execute any or all of the embodiments described above. In different embodiments, computer system 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 800 includes one or more processors 802 coupled to a system memory 804 via an input/output (I/O) interface 806. Computer system 800 further includes one or more cameras 808 coupled to the I/O interface 806. Computer system 800 further includes a network interface 810 coupled to I/O interface 806, and one or more input/output devices 812, such as cursor control device 814, keyboard 816, and display(s) 818. In some cases, it is contemplated that embodiments may be implemented using a single instance of computer system 800, while in other embodiments multiple such systems, or multiple nodes making up computer system 800, may be configured to host different portions or instances of embodiments. For example, in one embodiment some elements may be implemented via one or more nodes of computer system 800 that are distinct from those nodes implementing other elements.

In various embodiments, computer system 800 may be a uniprocessor system including one processor 802, or a multiprocessor system including several processors 802 (e.g., two, four, eight, or another suitable number). Processors 802 may be any suitable processor capable of executing instructions. For example, in various embodiments processors 802 may be general-purpose or embedded processors implementing any of a variety of instruction set architectures (ISAs), such as the x86, PowerPC, SPARC, or MIPS ISAs, or any other suitable ISA. Also, in some embodiments, one or more of processors 802 may include additional types of processors, such as graphics processing units (GPUs), application specific integrated circuits (ASICs), etc. In multiprocessor systems, each of processors 802 may commonly, but not necessarily, implement the same ISA. In some embodiments, computer system 800 may be implemented as a system on a chip (SoC). For example, in some embodiments, processors 802, memory 804, I/O interface 806 (e.g. a fabric), etc. may be implemented in a single SoC comprising multiple components integrated into a single chip. For example, an SoC may include multiple CPU cores, a multi-core GPU, a multi-core neural engine, cache, one or more memories, etc. integrated into a single chip. In some embodiments, an SoC embodiment may implement a reduced instruction set computing (RISC) architecture, or any other suitable architecture.

System memory 804 may be configured to store program instructions 820 accessible by processor 802. In various embodiments, system memory 804 may be implemented using any suitable memory technology, such as static random access memory (SRAM), synchronous dynamic RAM (SDRAM), nonvolatile/Flash-type memory, or any other type of memory. Additionally, existing camera control data 822 of memory 804 may include any of the information or data structures described above. In some embodiments, program instructions 820 and/or data 822 may be received, sent or stored upon different types of computer-accessible media or on similar media separate from system memory 804 or computer system 800. In various embodiments, some or all of the functionality described herein may be implemented via such a computer system 800.

In one embodiment, I/O interface 806 may be configured to coordinate I/O traffic between processor 802, system memory 804, and any peripheral devices in the device, including network interface 810 or other peripheral interfaces, such as input/output devices 812. In some embodiments, I/O interface 806 may perform any necessary protocol, timing or other data transformations to convert data signals from one component (e.g., system memory 804) into a format suitable for use by another component (e.g., processor 802). In some embodiments, I/O interface 806 may include support for devices attached through various types of peripheral buses, such as a variant of the Peripheral Component Interconnect (PCI) bus standard or the Universal Serial Bus (USB) standard, for example. In some embodiments, the function of I/O interface 806 may be split into two or more separate components, such as a north bridge and a south bridge, for example. Also, in some embodiments some or all of the functionality of I/O interface 806, such as an interface to system memory 804, may be incorporated directly into processor 802.

Network interface 810 may be configured to allow data to be exchanged between computer system 800 and other devices attached to a network 824 (e.g., carrier or agent devices) or between nodes of computer system 800. Network 824 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 810 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 812 may, in some embodiments, include one or more display terminals, keyboards, keypads, touchpads, scanning devices, voice or optical recognition devices, or any other devices suitable for entering or accessing data by one or more computer systems 800. Multiple input/output devices 812 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 810.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 800 may also be connected to other devices that are not illustrated, or instead may operate as a stand-alone system. In addition, the functionality provided by the illustrated components may in some embodiments be combined in fewer components or distributed in additional components.

Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. An image sensor, comprising:

a plurality of pixels, wherein at least some of the pixels each comprises:

a photodiode comprising a charge accumulation region configured to accumulate charge when exposed to light;

a floating diffusion region; and a transfer gate comprising:

one or more charge transfer regions formed vertically between the charge accumulation region and floating diffusion region; and a gate control region positioned horizontally proximate the charge transfer regions, wherein the transfer gate is configured to selectively transfer at least some of the charge from the charge accumulation region to the floating diffusion region through the charge transfer regions vertically between the charge accumulation region and floating diffusion region.

2. The image sensor of claim 1, wherein the transfer gate comprises:

a first charge transfer region formed above and at least partially overlapping the charge accumulation region of the photodiode; and a second charge transfer region formed (a) above and at least partially overlapping the first charge transfer region and (b) underneath and at least partially overlapping the floating diffusion region, wherein at least a portion of the second charge transfer region is disposed away from the floating diffusion by a physical gap to provide a potential barrier between the second charge transfer region and floating diffusion region.

3. The image sensor of claim 1, wherein the transfer gate is configured to:

be turned on to transfer the at least some charge from the charge accumulation region to the charge transfer regions; and be turned off to transfer the at least some charge from the charge transfer regions to the floating diffusion region.

4. The image sensor of claim 3, wherein the transfer gate is configured to be turned on in response to a positive voltage applied to the gate control region, and turned off in response to removal of the positive voltage from the gate control region or a negative voltage applied to the gate control region.

5. The image sensor of claim 1, wherein the first charge transfer region has a doping type same as the second charge transfer region, with the first charge transfer region having a higher dopant concentration than the second charge transfer region.

6. The image sensor of claim 1, wherein the gate control region is formed in a shape including a partial or complete circle surrounding a perimeter of the floating diffusion region.

7. The image sensor of claim 1, wherein the charge accumulation region is a n-type region, the first charge transfer region is a first p-type region, the second charge transfer region is a second p-type region, and the floating diffusion region is a n-type region.

8. The image sensor of claim 1, wherein the pixel further comprises at least one of: a reset switch for resetting a voltage of the floating diffusion region to a reset voltage, a source follower switch for buffering the voltage of the floating diffusion region, or a pixel selection switch for selectively coupling the floating diffusion region to a pixel output line for reading out the voltage of the floating diffusion region.

9. A system, comprising:

one or more lenses;

an image sensor comprising a plurality of pixels configured to receive light through the lenses, wherein at least some of the pixels each comprises:

a photodiode comprising a charge accumulation region configured to accumulate charge when exposed to the light passing through the lenses;

a floating diffusion region; and a transfer gate comprising:

one or more charge transfer regions formed vertically between the charge accumulation region and floating diffusion region; and a gate control region positioned horizontally proximate the charge transfer regions, wherein the transfer gate is configured to selectively transfer at least some of the charge from the charge accumulation region to the floating diffusion region through the charge transfer regions vertically between the charge accumulation region and floating diffusion region.

10. The system of claim 9, wherein the transfer gate comprises:

a first charge transfer region formed above and at least partially overlapping the charge accumulation region of the photodiode; and a second charge transfer region formed (a) above and at least partially overlapping the first charge transfer region and (b) underneath and at least partially overlapping the floating diffusion region, wherein at least a portion of the second charge transfer region is disposed away from the floating diffusion by a physical gap to provide a potential barrier between the second charge transfer region and floating diffusion region.

11. The system of claim 9, wherein the transfer gate is configured to:

be turned on to transfer the at least some charge from the charge accumulation region to the charge transfer regions; and be turned off to transfer the at least some charge from the charge transfer regions to the floating diffusion region.

12. The system of claim 9, wherein the first charge transfer region has a doping type same as the second charge transfer region, with the first charge transfer region having a higher dopant concentration than the second charge transfer region.

13. The system of claim 9, wherein the gate control region does not overlap the floating diffusion region.

14. The system of claim 9, wherein the gate control region is formed in a shape including a partial or complete circle surrounding a perimeter of the floating diffusion region.

15. The system of claim 9, wherein the charge accumulation region is a n-type region, the first charge transfer region is a first p-type region, the second charge transfer region is a second p-type region, and the floating diffusion region is a n-type region.

16. The system of claim 9, wherein each of the at least some pixels further comprises at least one of: a reset switch for resetting a voltage of the floating diffusion region to a reset voltage, a source follower switch for buffering the voltage of the floating diffusion region, or a pixel selection switch for selectively coupling the floating diffusion region to a pixel output line for reading out the voltage of the floating diffusion region.

17. A device, comprising:

an image capturing device, comprising:

one or more lenses;

an image sensor comprising a plurality of pixels configured to receive light through the lenses, wherein at least some of the pixels each comprises:

a photodiode comprising a charge accumulation region configured to accumulate charge when exposed to the light passing through the lenses;

a floating diffusion region; and a transfer gate comprising:

one or more charge transfer regions formed vertically between the charge accumulation region and floating diffusion region; and a gate control region positioned horizontally proximate the charge transfer regions, wherein the transfer gate is configured to selectively transfer at least some of the charge from the charge accumulation region to the floating diffusion region through the charge transfer regions vertically between the charge accumulation region and floating diffusion region, and one or more circuits configured to generate volage signals based on the charge transferred to the floating diffusion regions of the at least some pixels; and an image signal processor configured to process the voltage signals to produce one or more images.

18. The device of claim 17, wherein the transfer gate comprises:

a first charge transfer region formed above and at least partially overlapping the charge accumulation region of the photodiode; and a second charge transfer region formed (a) above and at least partially overlapping the first charge transfer region and (b) underneath and at least partially overlapping the floating diffusion region, wherein at least a portion of the second charge transfer region is disposed away from the floating diffusion by a physical gap to provide a potential barrier between the second charge transfer region and floating diffusion region.

19. The device of claim 17, wherein the transfer gate is configured to:

be turned on to transfer the at least some charge from the charge accumulation region to the charge transfer regions; and be turned off to transfer the at least some charge from the charge transfer regions to the floating diffusion region.

20. The image sensor of claim 1, wherein the one or more charge transfer regions includes at least two charge transfer regions, a first of the at least two charge transfer regions being formed above and at least partially overlapping the charge accumulation region of the photodiode, a second of the at least two charge transfer regions being formed above and at least partially overlapping the first;

wherein the gate control region is positioned laterally proximate both the first and the second of the at least the two charge transfer regions.

* * * * *